(12) United States Patent
Cyrusian et al.

(10) Patent No.: US 8,937,508 B2
(45) Date of Patent: Jan. 20, 2015

(54) DIFFERENTIAL AMPLIFIER

(71) Applicant: Marvell World Trade Ltd., St. Michael (BB)

(72) Inventors: Sasan Cyrusian, Scotts Valley, CA (US); Gregory T. Uehara, Austin, TX (US)

(73) Assignee: Marvell World Trade Ltd., St. Michael (BB)

( * ) Notice: Subject to any disclaimer, the term of this patent is extended or adjusted under 35 U.S.C. 154(b) by 44 days.

(21) Appl. No.: 13/661,883

(22) Filed: Oct. 26, 2012

(65) Prior Publication Data

US 2013/0106513 A1  May 2, 2013

Related U.S. Application Data

(60) Provisional application No. 61/554,907, filed on Nov. 2, 2011, provisional application No. 61/601,912, filed on Feb. 22, 2012.

(51) Int. Cl.
*H03F 3/45* (2006.01)

(52) U.S. Cl.
CPC .............. *H03F 3/45237* (2013.01); *H03F 3/45* (2013.01); *H03F 3/4565* (2013.01)
USPC ........................................................ 330/253

(58) Field of Classification Search
CPC .................................................... H03F 3/3016
USPC ................................ 330/297, 261, 290, 283
See application file for complete search history.

(56) References Cited

U.S. PATENT DOCUMENTS

| 5,939,904 A * | 8/1999 | Fetterman et al. ............. 327/67 |
| 6,034,568 A * | 3/2000 | Bonaccio et al. ............. 330/253 |
| 6,731,135 B2 * | 5/2004 | Brunolli ......................... 326/83 |
| 2003/0001666 A1 | 1/2003 | Watanabe et al. |
| 2004/0150474 A1 | 8/2004 | Wortel |

(Continued)

FOREIGN PATENT DOCUMENTS

WO    WO 2012101467 A1 *  8/2012

OTHER PUBLICATIONS

English translation of the International Search Report and Written Opinion issued Apr. 8, 2013, in PCT/US2012/062144 filed Oct. 26, 2012.

(Continued)

*Primary Examiner* — Robert Pascal
*Assistant Examiner* — Khiem Nguyen

(57) ABSTRACT

Aspects of the disclosure provide a differential amplifier. The differential amplifier includes a first pair of complementary transistors, a second pair of complementary transistors, and a current source. First control terminals of the first pair of complementary transistors are coupled to a first input node of the differential amplifier and first driving terminals of the first pair of complementary transistors are coupled to a first output node of the differential amplifier for driving a load. Second control terminals of the second pair of complementary transistors are coupled to a second input node of the differential amplifier and second driving terminals of the second pair of complementary transistors coupled to a second output node of the differential amplifier for driving the load. The current source is configured to maintain a substantially constant total current flow through the first pair of complementary transistors and the second pair of complementary transistors.

18 Claims, 16 Drawing Sheets

(56) References Cited

U.S. PATENT DOCUMENTS

| | | |
|---|---|---|
| 2004/0257119 A1 | 12/2004 | Watanabe et al. |
| 2005/0212599 A1* | 9/2005 | Lin et al. .................. 330/258 |
| 2009/0023413 A1 | 1/2009 | Xu et al. |
| 2009/0267691 A1 | 10/2009 | Chen |

OTHER PUBLICATIONS

Edward K.F. Lee, et al., "A 0.9 V Rail-to-Rail Constant $g_m$ Amplifier for Implantable Biomedical Applications", ISCAS 2006, XP-010938499, May 21, 2006, pp. 653-656.

* cited by examiner

US 8,937,508 B2

DIFFERENTIAL AMPLIFIER

INCORPORATION BY REFERENCE

This present disclosure claims the benefit of U.S. Provisional Application No. 61/554,907, "Efficient High Speed Amplifiers" filed on Nov. 2, 2011, and U.S. Provisional Application No. 61/601,912, "Efficient High Speed Amplifiers" filed Feb. 22, 2012, which are incorporated herein by reference in their entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

A differential amplifier typically includes a pair of matching transistors, such as a pair of matching bipolar transistors, a pair of matching metal-oxide-semiconductor (MOS) transistors, and the like. In an example, a differential amplifier includes a pair of matching N-type MOS transistors coupled with a current source, and two load components. Specifically, source terminals of the two N-type MOS transistors are coupled together and are coupled to the current source. Drain terminals of the two N-type MOS transistors are respectively coupled to the two load components. The differential amplifier receives a pair of differential inputs at gate terminals of two N-type MOS transistors, and generates a pair of differential outputs from the drain terminals of the two N-type MOS transistors.

SUMMARY

Aspects of the disclosure provide a differential amplifier. The differential amplifier includes a first pair of complementary transistors, a second pair of complementary transistors, and a current source. First control terminals of the first pair of complementary transistors are coupled to a first input node of the differential amplifier and first driving terminals of the first pair of complementary transistors are coupled to a first output node of the differential amplifier for driving a load. Second control terminals of the second pair of complementary transistors are coupled to a second input node of the differential amplifier and second driving terminals of the second pair of complementary transistors coupled to a second output node of the differential amplifier for driving the load. The current source is configured to maintain a substantially constant total current flow through the first pair of complementary transistors and the second pair of complementary transistors.

In an embodiment, the current source is a first current source. The differential amplifier further includes a second current source, and the first current source and the second current source are respectively configured to maintain a first substantially constant current from a high voltage source, and a second substantially constant current from a low voltage source.

According to an aspect of the disclosure, the differential amplifier includes a common mode feedback circuit configured to suppress a common mode response at the first output node and the second output node. In an embodiment, the common mode feedback circuit is configured to maintain a common mode voltage level at the first output node and the second output node with reference to a reference voltage. In an example, a reference voltage generator is configured to generate the reference voltage based on a third pair of complementary transistors that are diode-connected. The third pair of complementary transistors has matching characteristics to the first pair and the second pair.

Further, in an embodiment, the reference voltage generator is configured to generate a feedback signal to a voltage regulator to enable the voltage regulator to adjust a supply voltage to the differential amplifier based on the feedback signal. In an example, the voltage regulator is on a same integrated circuit (IC) chip as the differential amplifier. In another example, the voltage regulator is external to an integrated circuit (IC) chip that includes the differential amplifier.

Further, in an embodiment, the differential amplifier includes adjustable resistive components configured to adjust a gain of the differential amplifier.

According to an aspect of the disclosure, the load includes a first current source load and a second current source load that are respectively coupled to the output nodes. In an embodiment, the first current source load and the second current source load use transistors of a same type. Further, the load includes a third current source load of a complementary type to the first current source load, and a fourth current source load of a complementary type to the second current source load.

In an embodiment, the first pair of complementary transistors includes a first P-type metal-oxide-semiconductor (MOS) transistor, and a first N-type MOS transistor, the first control terminals are gate terminals of the first P-type MOS transistor and the first N-type MOS transistor, and the first driving terminals are drain terminals of the first P-type MOS transistor and the first N-type MOS transistor. The second pair of complementary transistors includes a second P-type MOS transistor, and a second N-type MOS transistor, the second control terminals are gate terminals of the second P-type MOS transistor and the second N-type MOS transistor, and the second driving terminals are drain terminals of the second P-type MOS transistor and the second N-type MOS transistor.

Aspects of the disclosure provide a circuit. The circuit includes a pair of complementary transistors configured to have matching characteristics as complementary transistors pairs in a differential amplifier. Further, the circuit includes a feedback signal generating circuit configured to generate a feedback signal based on a voltage drop on the pair of complementary transistors. The feedback signal is used to adjust a supply voltage to the differential amplifier.

Aspects of the disclosure provide another circuit. The circuit includes a first current source load and a second current source load that is complementary to the first current source load. The first current source load and the second current source load are configured to serve as load to a first pair of complementary transistors in a differential amplifier. The circuit also includes a third current source load and a fourth current source load that is complementary to the third current source load. The third current source load and the fourth current source load are configured to serve as load to a second pair of complementary transistors in the differential amplifier.

Aspects of the disclosure provide a method. The method includes receiving a pair of differential input signals at a first input node and a second input node of a differential amplifier. The first input node controls control terminals of a first pair of N-type and P-type transistors, and the second input node controls control terminals of a second pair of N-type and P-type transistors. Further, the method includes maintaining a substantially constant total current flowing through the transistors of a same type, and driving a load coupled between a first output node and a second output node of the differential amplifier with a current controlled by both types of transistors.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1A:
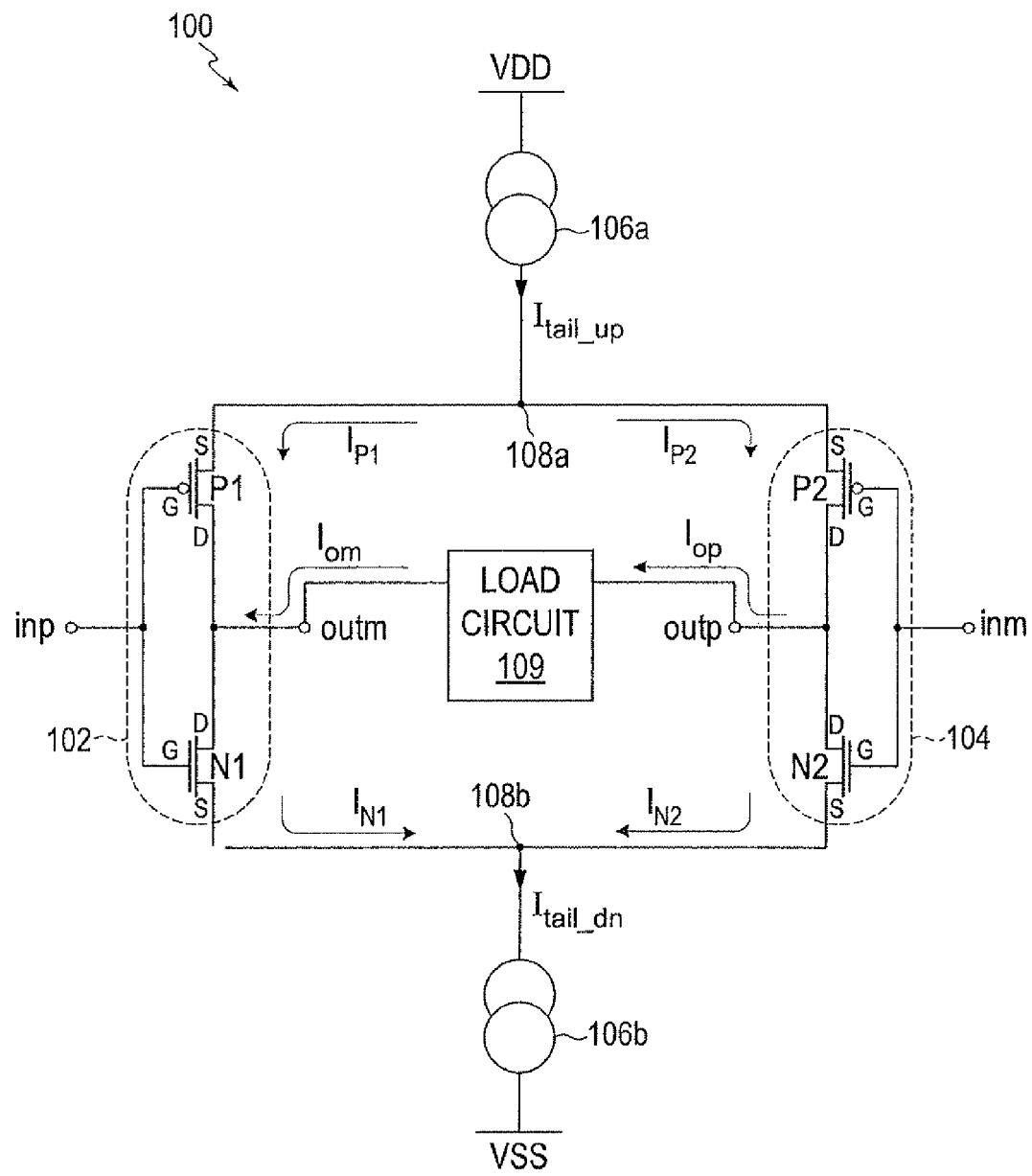
FIGS. 1A, 1B, and 1C show diagrams of differential amplifiers according to an embodiment of the disclosure.

FIG. 1A shows a diagram of a differential amplifier 100 according to an embodiment of the disclosure. The differential amplifier 100 includes a pair of matching complementary transistor pairs 102 and 104, current sources 106a and 106b, and a load circuit 109. These elements are coupled together as shown in FIG. 1A.

In the FIG. 1A example, the complementary transistor pair 102 includes an N-type metal-oxide-semiconductor (MOS) transistor N1, and a P-type MOS transistor P1 coupled together, and the complementary transistor pair 104 includes an N-type MOS transistor N2, and a P-type MOS transistor P2 coupled together. Specifically, gate terminals of the transistors N1 and P1 are coupled together to a first input node inp (non-inverting input) and gate terminals of the transistors N2 and P2 are coupled together to a second input node inm (inverting input); drain terminals of the transistors N1 and P1 are coupled together to a first output node outm and drain terminals of the transistors N2 and P2 are coupled together to a second output node outp.

According to an aspect of the disclosure, the N-type transistors N1 and N2 are matching transistors, and the P-type transistors P1 and P2 are matching transistors. In an example, the transistors N1 and N2 are formed of substantially same patterns in layers, thus the transistors N1 and N2 have substantially same doping, same sizes, same orientation, and the like, and have substantially same transistor characteristics. Similarly, the transistors P1 and P2 are formed of substantially same patterns in layers, thus the transistors P1 and P2 have substantially same doping, same sizes, same orientation, and the like, and have substantially same transistor characteristics.

Further, source terminals of the transistors P1 and P2 are coupled together to the current source 106a, and source terminals of the transistors N1 and N2 are coupled together to the current source 106b. In an embodiment, the current sources 106a and 106b provide bias currents to bias the transistors P1, P2, N1 and N2 at the appropriate operation conditions. In an example, the current source 106a provides a relatively constant total current $I_{tail\_up}$ to the transistors P1 and P2, and the current source 106b provides a relatively constant total current $I_{tail\_dn}$ to the transistors N1 and N2. The sum of currents $I_{P1}$ and $I_{P2}$ flowing through the P-type MOS transistors P1 and P2 is equal to $I_{tail\_up}$ and is substantially constant. Similarly, the sum of currents $I_{N1}$ and $I_{N2}$ flowing through the N-type MOS transistors N1 and N2 is equal to $I_{tail\_dn}$ and is substantially constant. In an example, $I_{tail\_up}$ is substantially equivalent to $I_{tail\_dn}$.

During operation, the input nodes inp and inm receive a pair of differential input signals, the pair of matching complementary transistor pairs 102 and 104 amplify the differential input signals, and drive the load circuit 109. Thus, the output nodes outm and outp generate a pair of differential output signals.

Specifically, in an example, when a voltage difference ($\Delta V_{in}$) of the pair of differential input signals becomes larger, a voltage on the input node inp becomes larger, and a voltage on the input node inm becomes smaller. The larger voltage on the input node inp causes the current flowing through the transistor N1 ($I_{N1}$) to be larger, and also causes the current flowing through the transistor P1 ($I_{P1}$) to be smaller. Then, a load current flowing into the output node outm (Iom) becomes larger. The smaller voltage on the input node inm causes the current flowing through the transistor N2 ($I_{N2}$) to be smaller, and also causes the current flowing through the transistor P2 ($I_2$) to be larger. Then, a load current flowing out of the output node outp (Iop) becomes larger. In an example, the load current Iom is the same as the load current Iop. The larger load currents then cause a voltage difference of the pair of differential output signals on the output nodes outm and outp to be larger.

According to an embodiment of the disclosure, both the N-type transistors (N1 and N2), and the P-type transistors (P1 and P2) contribute to signal amplification. In an example, a manufacturing process produces N-type MOS transistors N1 and N2 and P-type MOS transistors P1 and P2 with about the same trans-conductance for the same current density. Thus, when the N-type MOS transistors N1 and N2 and P-type MOS transistors P1 and P2 have the same width and length, the transistors N1, N2, P1 and P2 have about the same trans-conductance ($g_m$), then the effective trans-conductance of differential amplifier 100 can be expressed as Eq. 1

$$\frac{\partial \Delta I_{om}}{\partial \Delta V_{in}} = 2 \times g_m \qquad \text{Eq. 1}$$

Thus, the effective trans-conductance of the differential amplifier 100 is about twice the trans-conductance of another differential amplifier that uses only the N-type MOS transistor N1 and N2 for signal amplification, for example.

In another example, the width of the transistors N1, N2, P1 and P2 in the differential amplifier 100 is reduced by half, thus a total gate area of the differential amplifier 100 is about the same as the other differential amplifier that includes only the N-type MOS transistors of the non-reduced sizes. Then, the differential amplifier 100 has about the same input capacitance as the other differential amplifier, and has about the same effective trans-conductance as the other differential amplifier. In an example, due to the width reduction, the bias currents in the differential amplifier 100 are reduced by half in order to bias the transistors in the differential amplifier 100 to operate in the similar operation conditions as the other differential amplifier, and thus the differential amplifier 100 consumes half of the current consumed by the other differential amplifier. Thus, the differential amplifier 100 achieves reduced current consumption for the same input capacitance and same effective trans-conductance.

It is noted that, in some embodiments, only one current source is used.

Figure 1B:
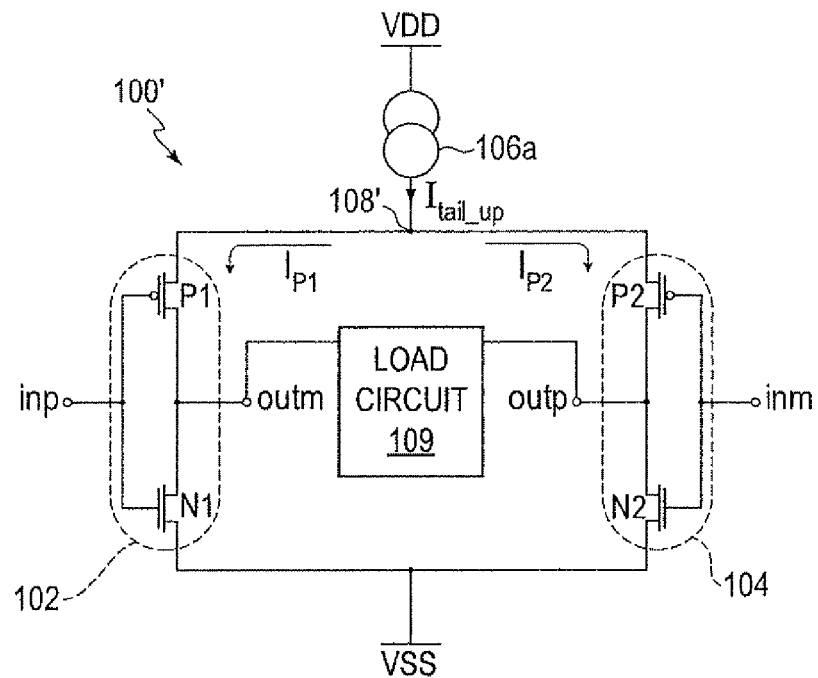
Figure 1C:
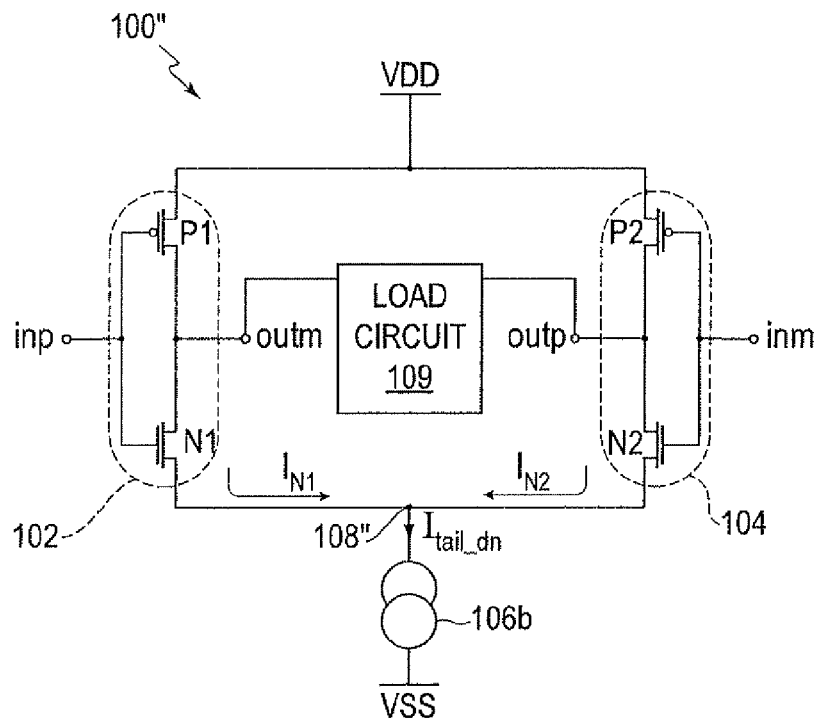

FIGS. 1B and 1C respectively show diagrams of a differential amplifier 100' and a differential amplifier 100" according to an embodiment of the disclosure. The differential amplifier 100' and the differential amplifier 100" operate similarly to the differential amplifier 100 described above. The differential amplifier 100' and the differential amplifier 100" also utilize certain components that are identical or equivalent to those used in the differential amplifier 100; the description of these components has been provided above and will be omitted here for clarity purposes. In FIG. 1B, the differential amplifier 100' includes only one current source 106a. The source terminals of the transistors N1 and N2 are connected to a low voltage supply, such as VSS. In FIG. 1C, the differential amplifier 100" includes only one current source 106b, and the source terminals of the transistors P1 and P2 are connected to a high voltage supply, such as VDD.

Figure 2A:
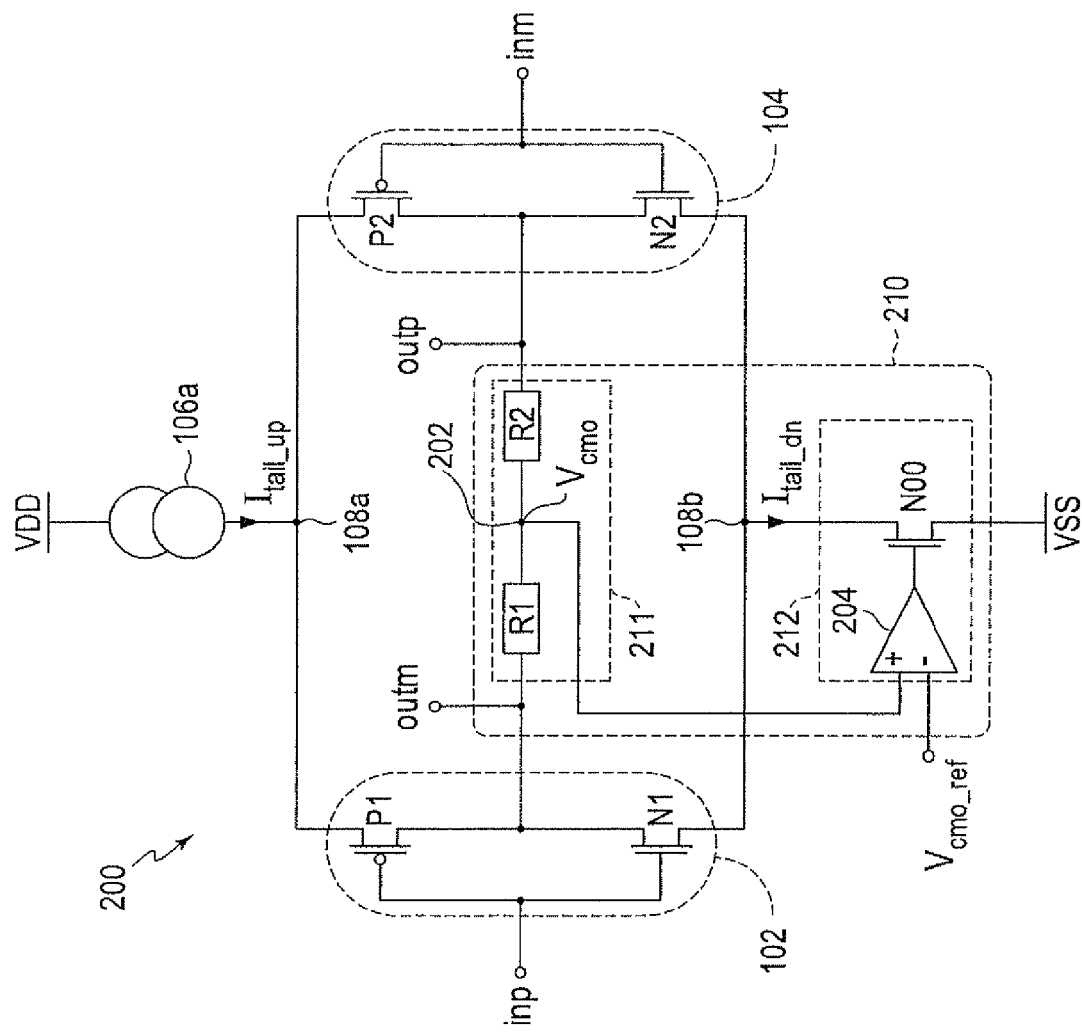
FIGS. 2A and 2B show diagrams of differential amplifiers with common mode feedback according to an embodiment of the disclosure.

FIG. 2A shows a diagram of a differential amplifier 200 according to an embodiment of the disclosure. The differential amplifier 200 operates similarly to the differential amplifier 100 described above. The differential amplifier 200 also utilizes certain components that are identical or equivalent to those used in the differential amplifier 100; the description of these components has been provided above and will be omitted here for clarity purposes. It is noted that, for ease and clarity, the load circuit is not shown. The differential amplifier 200 uses a common mode feedback to adjust one of the bias current sources to suppress common mode response, such as common mode response due to temperature change induced device characteristics changes, and the like.

Specifically, in the FIG. 2A example, the differential amplifier 200 includes a common mode feedback (CMFB) controlled bias current source 210. The CMFB controlled bias current source 210 includes a common mode sensing portion 211, and a controllable bias current source portion 212. In the FIG. 2A example, the common mode sensing portion 211 includes two resistive components R1 and R2 coupled in series between the two output nodes outm and outp. In an example, the resistive components R1 and R2 have the same resistance, and thus a sensed voltage at node 202 ($V_{cmo}$) is indicative of the common mode response.

The controllable bias current source portion 212 includes an amplifier 204, and a transistor to provide the bias current $I_{tail\_dn}$, such as an N-type MOS transistor N00. The amplifier 204 compares the sensed voltage $V_{cmo}$ with a reference voltage $V_{cmo\_ref}$, and uses the comparison result to control the N-type MOS transistor N00 with negative feedback. In an example, due to the common mode response, both of the voltages at the output nodes outm and outp become larger, thus the voltage at node 202 $V_{cmo}$ is larger, thereby the controllable bias current source portion 212 increases the bias current $I_{tail\_dn}$. Accordingly, the source-drain currents of the N-type MOS transistor N1 and N2 increase. The increased source-drain currents lower the voltages at the output nodes outm and outp, and thus suppress the common mode response.

It is noted that, in an example, the resistance of the resistive components R1 and R2 are much larger than the output impedance of the load circuit (not shown). It is also noted that the common mode sensing portion 211 can be suitably modified. In an example, the resistive components R1 and R2 are implemented by transistors, such as transistors in current source topology. In another example, the common mode sensing portion 211 uses capacitive components.

It is also noted that the differential amplifier 200 can be suitably modified. In an example, the common mode feedback is used to adjust the bias current $I_{tail\_up}$ to suppress the common mode response.

Figure 2B:
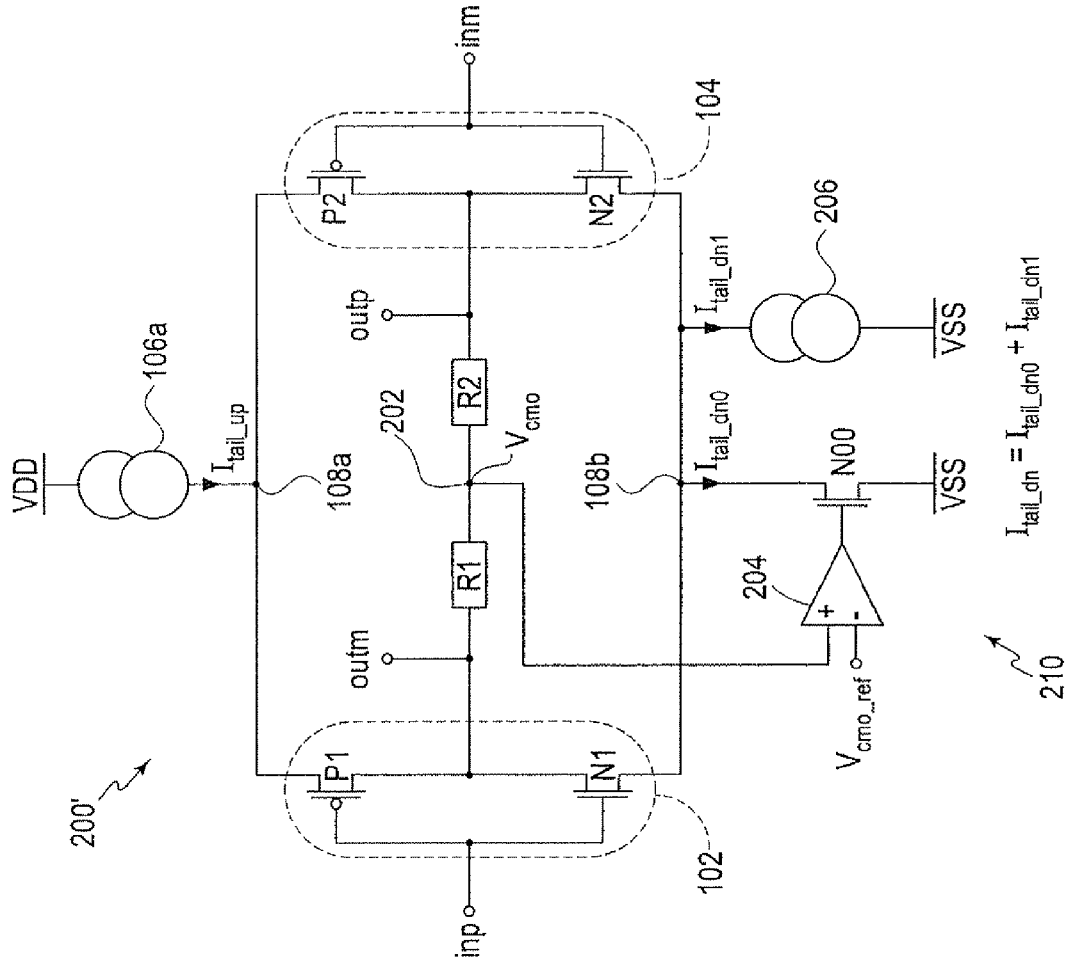

FIG. 2B shows a diagram of another differential amplifier 200' modified from the differential amplifier 200. The differential amplifier 200' operates similarly to the differential amplifier 200 described above. The differential amplifier 200' also utilizes certain components that are identical or equivalent to those used in the differential amplifier 200; the description of these components has been provided above and will be omitted here for clarity purposes. However, the total bias current ($I_{tail\_dn}$) to the N-type transistors N1 and N2 is provided by two sources, a current source 206 providing a first portion and the N-type MOS transistor N00 providing a second portion $I_{tail\_dn0}$. The first portion $I_{tail\_dn1}$ is relatively constant, and the second portion is adjusted based on common mode feedback.

Figure 3A:
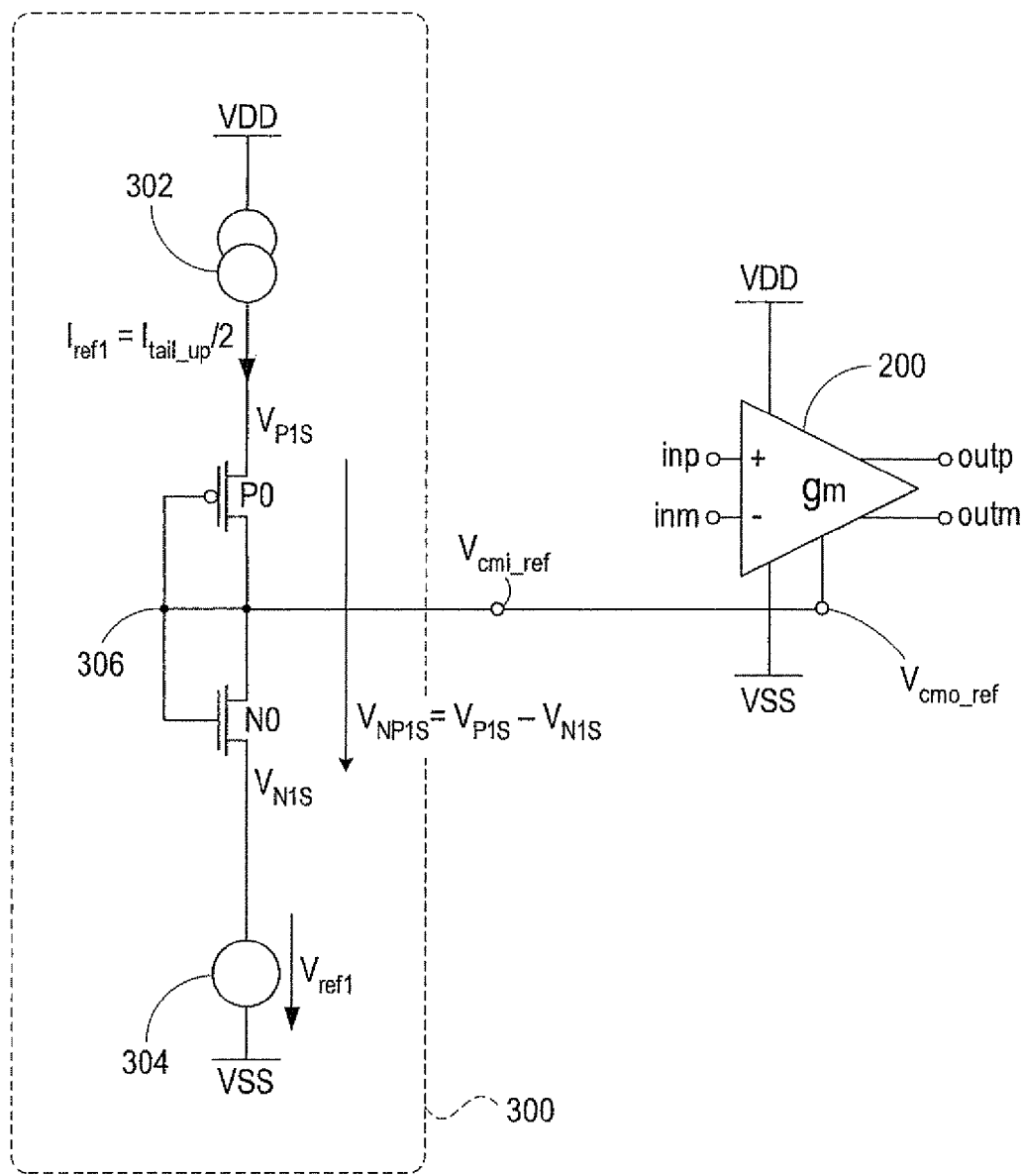
FIG. 3A shows a diagram of a reference voltage generator according to an embodiment of the disclosure.

FIG. 3A shows a diagram of a circuit 300 to generate the reference voltage $V_{cmo\_ref}$ for use in the CMFB controlled bias current source 210 according to an embodiment of the disclosure. The circuit 300 includes a pair of complementary transistors P-type MOS transistor P0 and N-type MOS transistor N0, a current source 302 and a voltage source 304. These elements are coupled together as shown in FIG. 3A.

In an example, the circuit 300 is manufactured on a same integrated circuit (IC) chip as the differential amplifier 200. Further, the P-type MOS transistor P0 is a matching transistor to the transistors P1 and P2, and thus has substantially the same transistor characteristics as the transistors P1 and P2; similarly, the N-type MOS transistor N0 is a matching transistor to the transistors N1 and N2, and thus has substantially the same transistor characteristics as the transistors N1 and N2. Thus, the complementary pair P0 and N0 matches the complementary pair P1 and N1, and the complementary pair P2 and N2.

In the FIG. 3A example, the current source 302 provides a constant bias current $I_{ref1}=I_{tail\_up}/2$ to the P-type MOS transistor P0, which is half of the total bias current to the P-type MOS transistor P1 and P2 that is provided by the current source 106a. In an embodiment, the current source 302 and the current source 106a are formed using a current mirror structure.

The voltage source 304 can be any suitable voltage source. In an example, the voltage source 304 is a band-gap voltage based voltage source. In another example, the voltage source 304 is replaced by a current source that provides a constant bias current that is half of the total bias current to the N-type MOS transistor N1 and N2.

The complementary pair P0 and N0 is coupled together similarly to the complementary pair P1 and N1 or P2 and N2, except the gate terminals of P0 and N0 are coupled with the drain terminals of the P0 and N0, which is referred to as diode-connected. The coupled gate/drain terminals of P0 and N0 generate a voltage $V_{cmi\_ref}$. The voltage $V_{cmi\_ref}$ is then used as the reference voltage $V_{cmo\_ref}$ in the differential amplifier 200.

It is noted that, in an example, because the gate terminal and the drain terminal of P0 are shorted, the source-drain voltage of P0 is a function of the constant bias current $I_{ref1}$ and transistor characteristics of P0. In an example, the current $I_D$ flowing through P0 can be expressed as in Eq. 2:

$$I_D = I_{ref1} = -\frac{1}{2}\mu_p C_{ox} \frac{W}{L}(V_{DS} - V_{TH})^2 \qquad \text{Eq. 2}$$

where $\mu_p$ is mobility of holes, $C_{ox}$ is the gate oxide capacitance per unit area, W is the channel width of P0, L is the channel length of P0, $V_{DS}$ is the drain-source voltage, and $V_{TH}$ is the threshold voltage of P0. Thus, the source-drain voltage of P0 is a function of the constant bias current $T_{ref1}$ and transistor characteristics of P0.

Similarly, the source-drain voltage of the N0 is a function of the constant bias current $T_{ref1}$ and transistor characteristics of N0.

According to an embodiment of the disclosure, because the reference voltage $V_{cmo\_ref}$ is generated based on the transistors P0 and N0 that match the complementary pair P1 with N1, and the complementary pair P2 with N2, the reference voltage $V_{cmo\_ref}$ tracks the common-mode response of the differential amplifier 200, such as common mode response due to process, voltage, and temperature (PVT) variation effects. Thus, using the circuit 300 to generate the reference voltage $V_{cmo\_ref}$, the differential amplifier 200 achieves high common mode rejection over PVT variations.

Figure 3B:
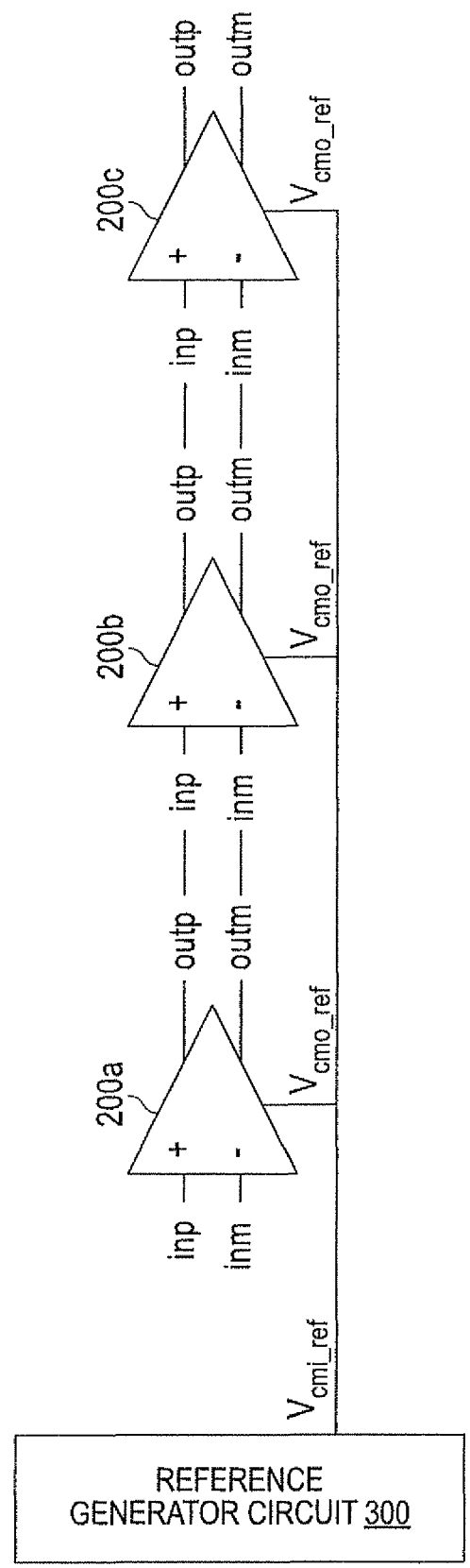
FIG. 3B shows a cascade of differential amplifiers according to an embodiment of the disclosure.

FIG. 3B shows a diagram of a plurality of differential amplifiers 200a-200c using the voltage $V_{cmi\_ref}$ of generated by the circuit 300 as reference voltages according to an embodiment of the disclosure. In an example, each of the plurality of differential amplifiers 200a-200c has the same structure as the differential amplifier 200, and operates similarly to the differential amplifier.

In the FIG. 3B example, the plurality of differential amplifiers 200a-200c is coupled in a cascade structure. For example, the output terminals outp and outm of the differential amplifier 200a are respectively coupled to the input terminals inp and inm of a subsequent differential amplifier, such as the differential amplifier 200b, and the output terminals outp and outm of the differential amplifier 200b are respectively coupled to the input terminals inp and inm of a further subsequent differential amplifier, such as the differential amplifier 200c, so on and so forth.

In addition, the plurality of differential amplifiers 200a-200c uses the voltage $V_{cmi\_ref}$ generated by the circuit 300 as the reference voltage $V_{cmo\_ref}$ to suppress common mode response.

Figure 4A:
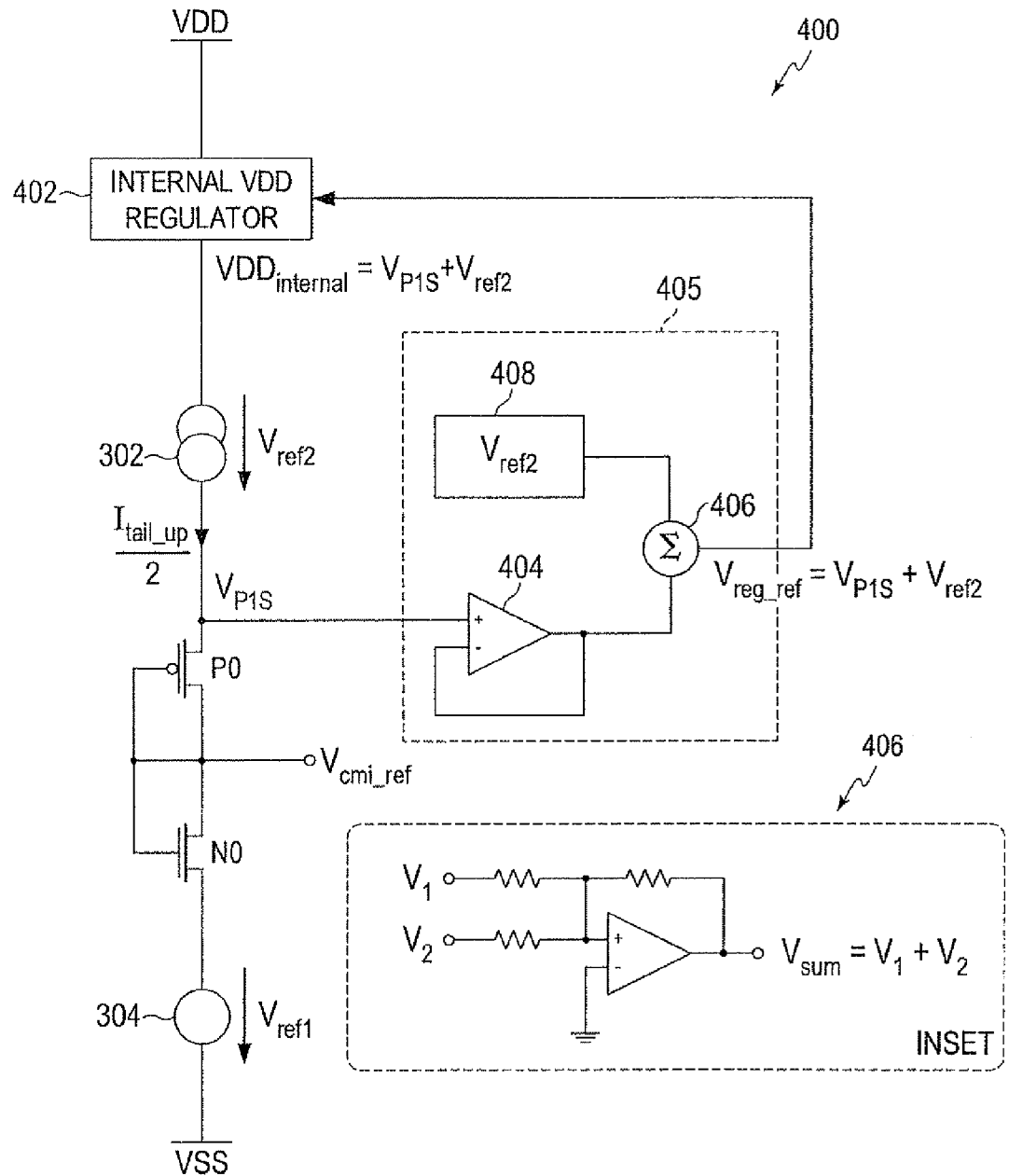
FIG. 4A shows a diagram of another reference voltage generator according to an embodiment of the disclosure.

FIG. 4A shows a diagram of a circuit 400 for generating an internal voltage supply $VDD_{internal}$ according to an embodiment of the disclosure. The circuit 400 utilizes certain components, such as the current source 302, the P-type MOS transistor P0, the N-type MOS transistor N0 and the voltage reference 304, that are identical or equivalent to those used in the circuit 300; the description of these components has been provided above and will be omitted here for clarity purposes.

Additionally, the circuit 400 includes an internal VDD regulator 402 configured to receive a power supply VDD, such as the power supply received from an external power source of the IC chip, and to generate the internal voltage supply $VDD_{internal}$. According to an aspect of the disclosure, the internal voltage supply $VDD_{internal}$ is reduced from the power supply VDD to reduce power dissipation. According to another aspect of the disclosure, some transistors or all the transistors on the IC chip have relatively thin gate oxide, and thus the maximum voltage rating of the transistors is about or lower than (VDD–VSS). The internal voltage supply $VDD_{internal}$ is reduced from the power supply VDD to a level that is safe for those transistors to avoid electrical overstress conditions.

In the FIG. 4A example, the circuit 400 includes a feedback signal generating circuit 405 configured to generate a regulator reference voltage $V_{reg\_ref}$ and provide the regulator reference voltage $V_{reg\_ref}$ to the internal VDD regulator 402. Then, the internal VDD regulator 402 generates the internal voltage supply $VDD_{internal}$ based on regulator reference voltage $V_{reg\_ref}$, such as at the same voltage level as the regulator reference voltage $V_{reg\_ref}$.

In an example, the feedback signal generating circuit 405 includes an operational amplifier 404, an adder 406, and a voltage reference 408. The voltage reference 408 is configured to provide a voltage $V_{ref2}$ to the adder 406. The operation amplifier 404 is configured as a buffer to provide the source voltage of the transistor P0 to the adder 406. The adder 406 adds up the source voltage with the voltage $V_{ref2}$ to generate the regulator reference voltage $V_{reg\_ref}$. When the internal VDD regulator 402 generates the internal voltage supply $VDD_{internal}$ to have the same voltage level as the regulator reference voltage $V_{reg\_ref}$, the voltage drop on the current source 302 is the voltage $V_{ref2}$.

Further, in the FIG. 4A example, the regulator reference voltage $V_{reg\_ref}$ is generated based on the source-drain voltage drop on P0, and the drain-source voltage drop on N0. Because source-drain voltage drop on P0 is based on transistor characteristics of P0, and the drain-source voltage drop on N0 is based on transistor characteristics of N0. The transistor characteristics may be affected by variations, such as process variations, temperature variations and the like. Then, the regulator reference voltage $V_{reg\_ref}$ tracks voltage drops variations due to the process and temperature variations to achieve certain saturation currents for P0 and N0. Thus, the internal voltage supply $VDD_{internal}$ is adjusted over process and temperature variations to enable P0 and N0 to achieve certain operating points, such as the saturation current for diode-connected topology.

Further, the internal voltage supply $VDD_{internal}$ is provided as the power supply to other circuits on the same chip with the circuit 400. Because the internal voltage supply $VDD_{internal}$ is adjusted to offset the process and temperature variations, and the other circuits can also achieve certain operating points over process and temperature variations.

Figure 4B:
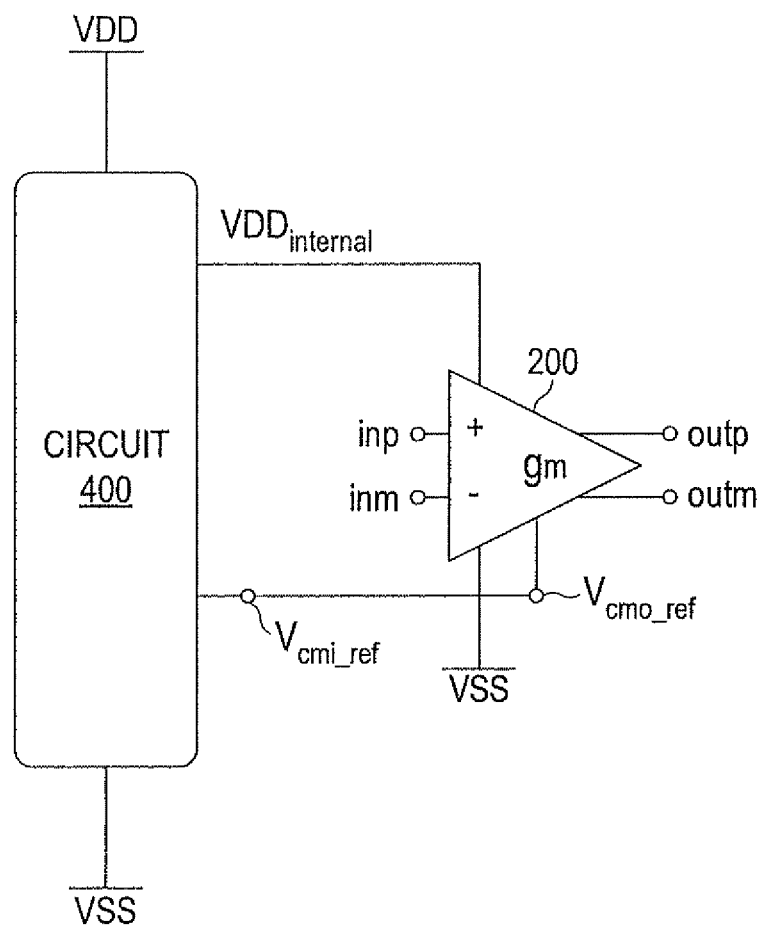
FIG. 4B shows a diagram of a differential amplifier that uses the reference voltage generator of FIG. 4A according to an embodiment of the disclosure.

FIG. 4B shows a diagram that the circuit 400 provides the internal voltage supply $VDD_{internal}$ as the positive supply voltage and provides the voltage $V_{cmi\_ref}$ as the reference voltage $V_{cmo\_ref}$ to support the operation of the differential amplifier 200. In an example, the complementary pairs P1 with N1, and P2 with N2 match the matching complementary pair P0 with N0, thus the adjustment of the power supply offsets the process and temperature variations, and the complementary pairs P1 with N1, and P2 with N2 can achieve certain operating points over process and temperature variations.

It is also noted that, in an example, the regulator reference voltage $V_{reg\_ref}$ can be provided to an external voltage regulator that is outside of an IC chip to adjust a supply voltage to the IC chip.

Figure 5:
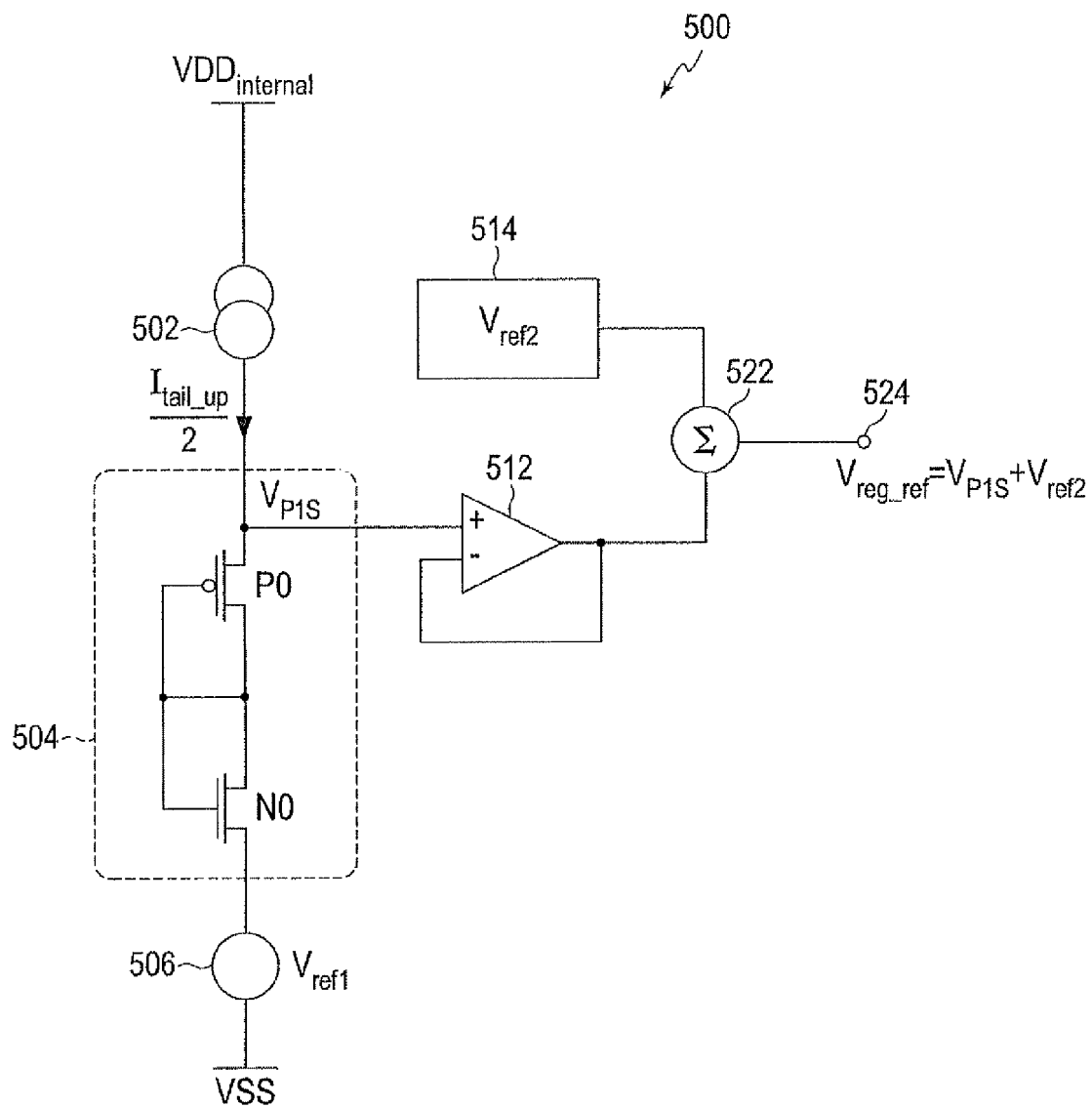
FIG. 5 shows a voltage regulator in accordance with the present disclosure.

FIG. 5 shows a power control circuit 500 according to an embodiment of the disclosure. The power control circuit 500 utilizes certain components that are identical or equivalent to those used in the circuit 400; the description of these components has been provided above and will be omitted here for clarity purposes.

In the FIG. 5 example, a regulator reference voltage $V_{reg\_ref}$ is generated similarly to the example in FIG. 4A. However, the power control circuit 500 does not have an internal voltage regulator. The regulator reference voltage $V_{reg\_ref}$ is provided to an external voltage regulator (not shown), and the external voltage regulator provides the power supply voltage $VDD_{internal}$ based on the regulator reference voltage $V_{reg\_ref}$.

Figure 6A:
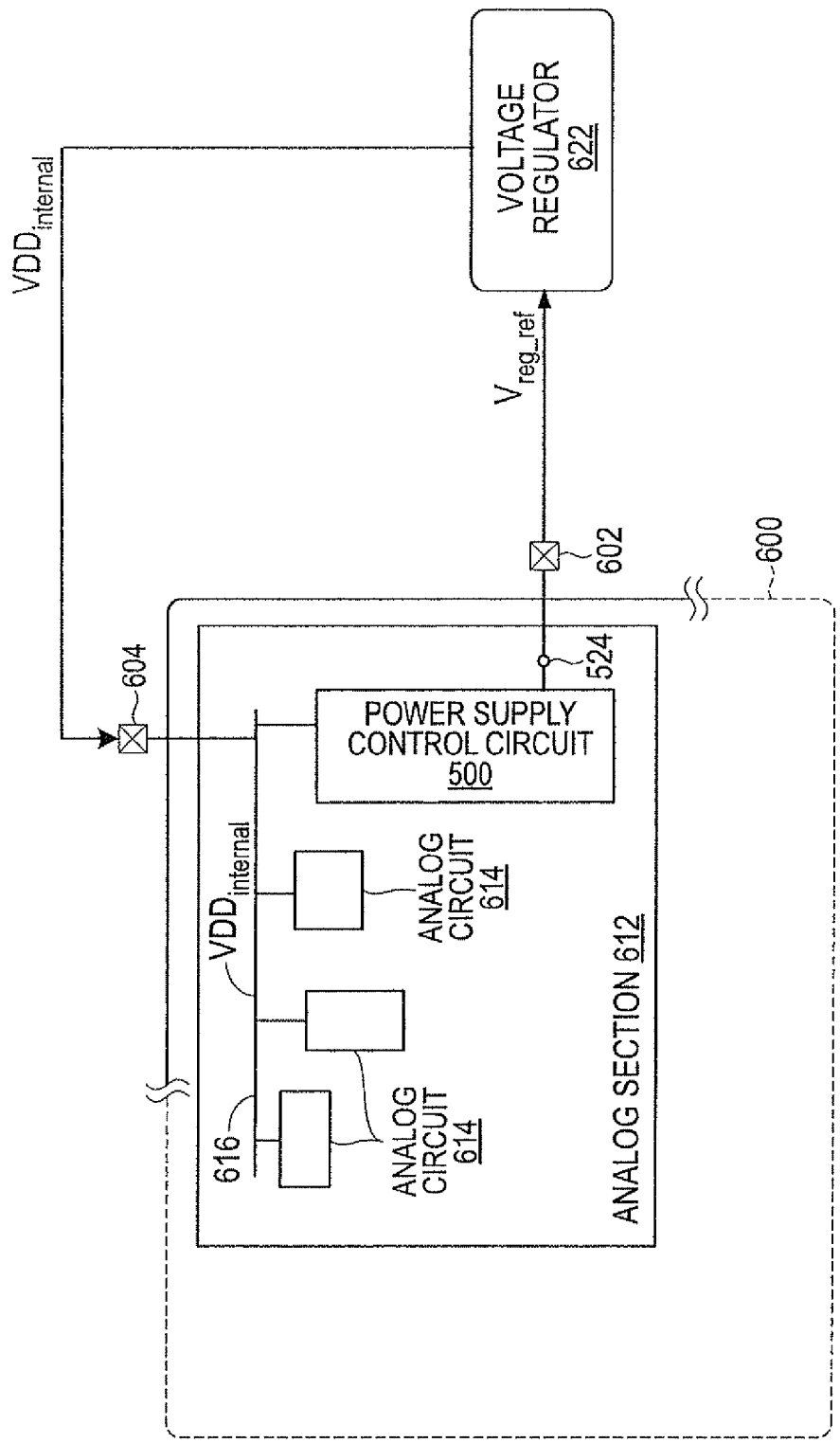
FIGS. 6A and 6B show diagrams of using external voltage regulator according to an embodiment of the disclosure.

FIG. 6A shows a diagram of an IC chip 600 coupled with a voltage regulator 622 that is external to the IC chip 600 according to an embodiment of the disclosure. In an example, the voltage regulator 622 and the IC chip 600 are assembled on a printed circuit board.

A portion of the circuits on the IC chip 600 is analog circuits. For example, the IC chip 600 includes an analog section 612 of analog circuits. In the FIG. 6A example, the analog section 612 includes a plurality of analog circuits 614, and the power control circuit 500. The power control circuit 500 provides the regulator reference voltage $V_{reg\_ref}$ to the external voltage regulator 622. The external voltage regulator 622 regulates a power supply to a power supply input pad 604 of the IC chip 600 based on the regulator reference voltage $V_{reg\_ref}$. For example, the power supply has a voltage potential $VDD_{internal}$ that is substantially the same as the regulator reference voltage $V_{reg\_ref}$.

In an example, the IC chip 600 includes a power distribution grid 616 that distributes the received power supply from the power supply input pad 604 to the plurality of analog circuits 614.

It is noted that other sections of the IC chip 600 can utilize a different power supply from the analog section 612 or the same power supply as the analog section 612.

Figure 6B:
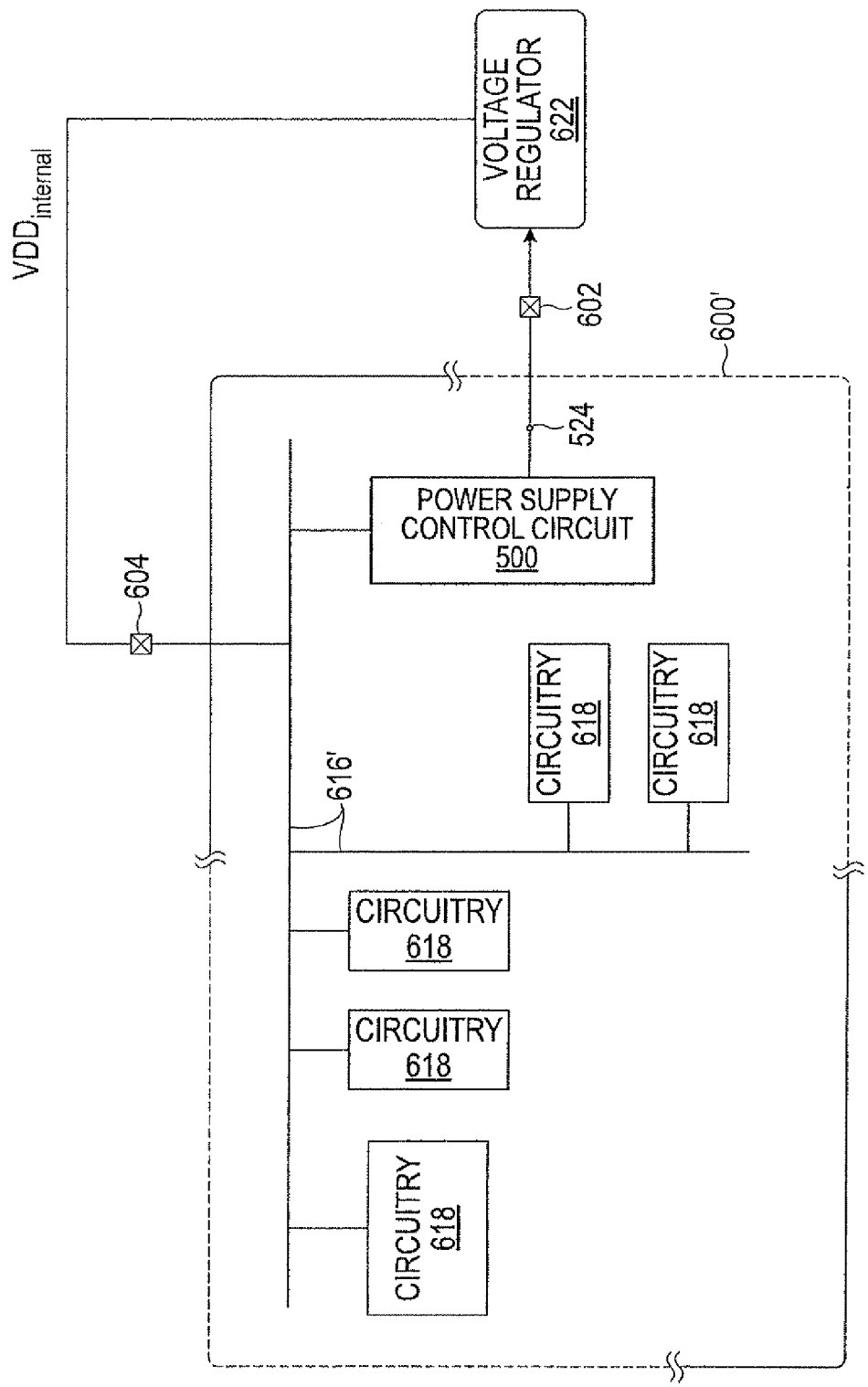

FIG. 6B shows another diagram of an IC chip 600' coupled with the voltage regulator 622 that is external to the IC chip 600' according to an embodiment of the disclosure. In an example, the voltage regulator 622 and the IC chip 600' are assembled on a printed circuit board. In FIG. 6B example, the received power supply on the power supply input pad 604 is distributed by a power grid 616' to all the circuits on the IC chip 600'.

According to an embodiment of the disclosure, the voltage level $VDD_{internal}$ is maintained near a minimum voltage level that is needed for circuits to operate to reduce power consumption. In addition, the voltage level $VDD_{internal}$ is adjusted by the voltage regulator 622 based on the regulator reference voltage $V_{reg\_ref}$ to offset variations, such as process variations, temperature variations, and the like.

It is noted the disclosed differential amplifiers, such as the differential amplifiers 100, 100', 100", 200, 200' and the like, can be suitably modified for various applications, such as variable gain amplifier, programmable gain amplifier, continuous time linear equalizer, and the like.

Figure 7:
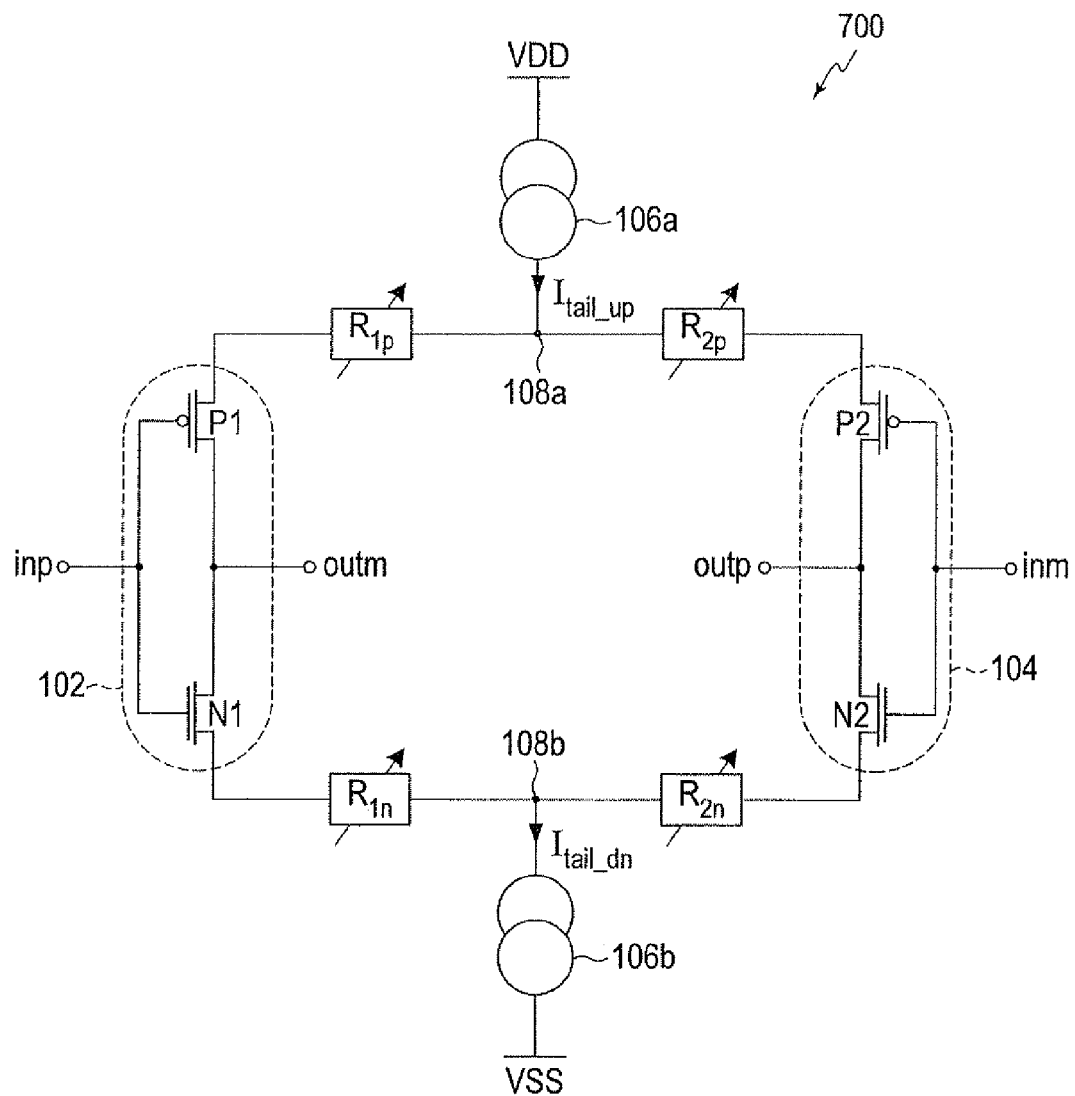
FIG. 7 shows a diagram of a differential amplifier with degeneration resistors according to an embodiment of the disclosure.

FIG. 7 shows a diagram of a differential amplifier 700 according to an embodiment of the disclosure. The differential amplifier 700 utilizes certain components that are identical or equivalent to those used in the differential amplifier 100; the description of these components has been provided above and will be omitted here for clarity purposes.

In the FIG. 7 example, the differential amplifier 700 includes degeneration resistors $R_{1p}$, $R_{1n}$, $R_{2p}$, and $R_{2n}$. In an example, the resistances of the degeneration resistors $R_{1p}$, $R_{2p}$, $R_{1n}$, and $R_{2n}$ can be adjusted to change the gain of the differential amplifier 700. Thus, the differential amplifier 700 can be used in variable gain amplifier, programmable gain amplifier, continuous time linear equalizer, and the like applications.

It is noted that the degeneration resistors $R_{1p}$, $R_{2p}$, $R_{1n}$, and $R_{2n}$ can be implemented using any suitably techniques, such as resistor arrays, MOS transistors, and the like.

In an embodiment, the differential amplifier 700 includes the resistor pair $R_{1p}$ and $R_{2p}$ but not the resistor pair $R_{1n}$ and $R_{2n}$. In other embodiment, the differential amplifier 700 includes the resistor pair $R_{1n}$ and $R_{2n}$ while omitting the resistor pair $R_{1p}$ and $R_{2p}$. The resistor values for the degeneration resistors $R_{1p}$, $R_{2p}$, $R_{1n}$, and $R_{2n}$ may or may not have the same values.

Figure 8:
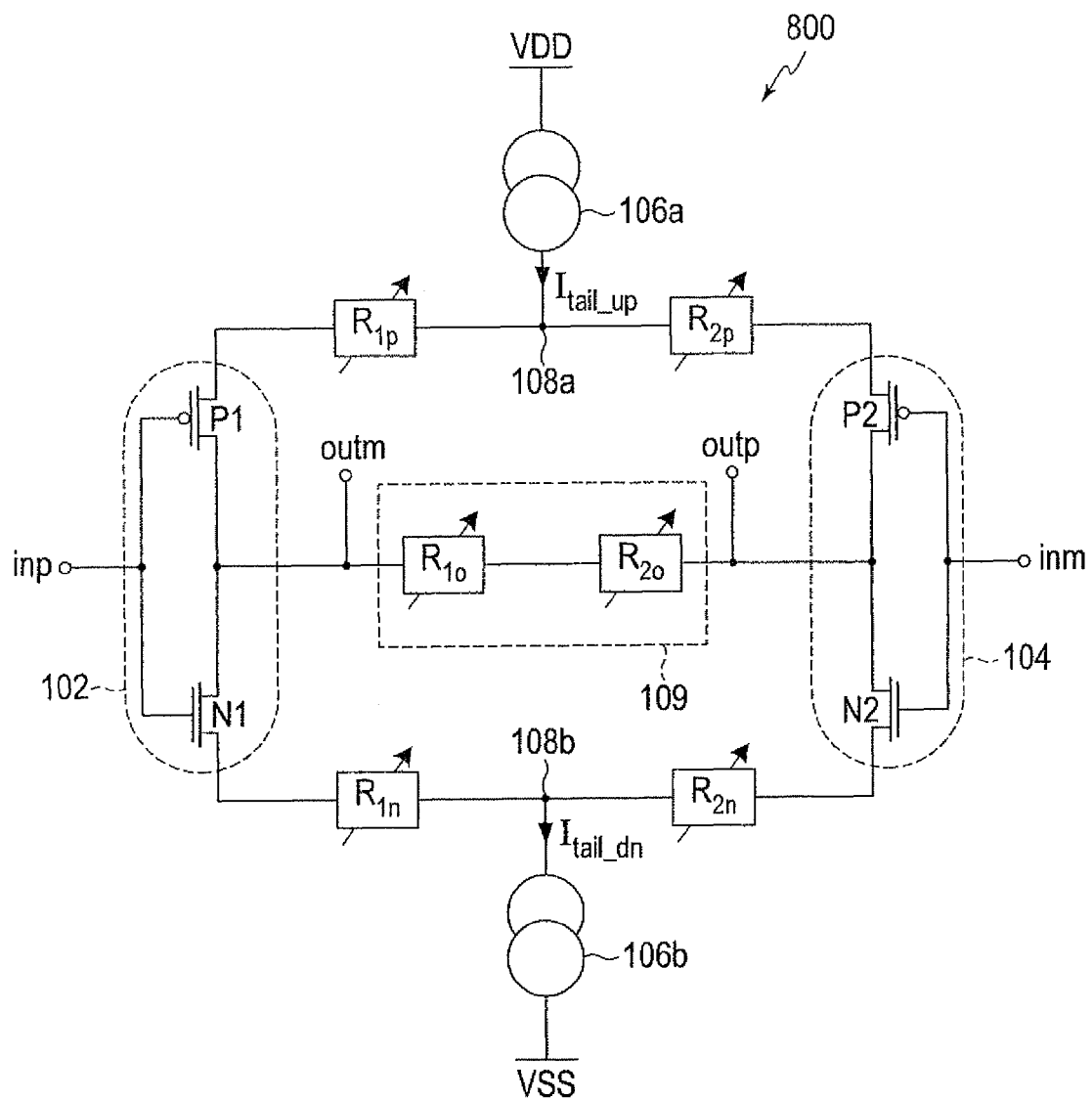
FIG. 8 shows a diagram of a differential amplifier with output resistors according to an embodiment of the disclosure.

FIG. 8 shows a block diagram of another differential amplifier 800 according to an embodiment of the disclosure. The differential amplifier 800 utilizes certain components that are identical or equivalent to those used in the differential amplifier 700; the description of these components has been provided above and will be omitted here for clarity purposes.

In the FIG. 8 example, the differential amplifier 800 includes two output resistive components $R_{1o}$ and $R_{2o}$ in the load circuit 109. In an example, the resistances of the output resistive components $R_{1o}$ and $R_{2o}$ can be adjusted to change the gain of the differential amplifier 800. It is noted that the output resistive components $R_{1o}$ and $R_{2o}$ can be implemented as resistors and/or transistors, such as diode-connected transistors, current source configured transistors, and the like.

Figure 9A:
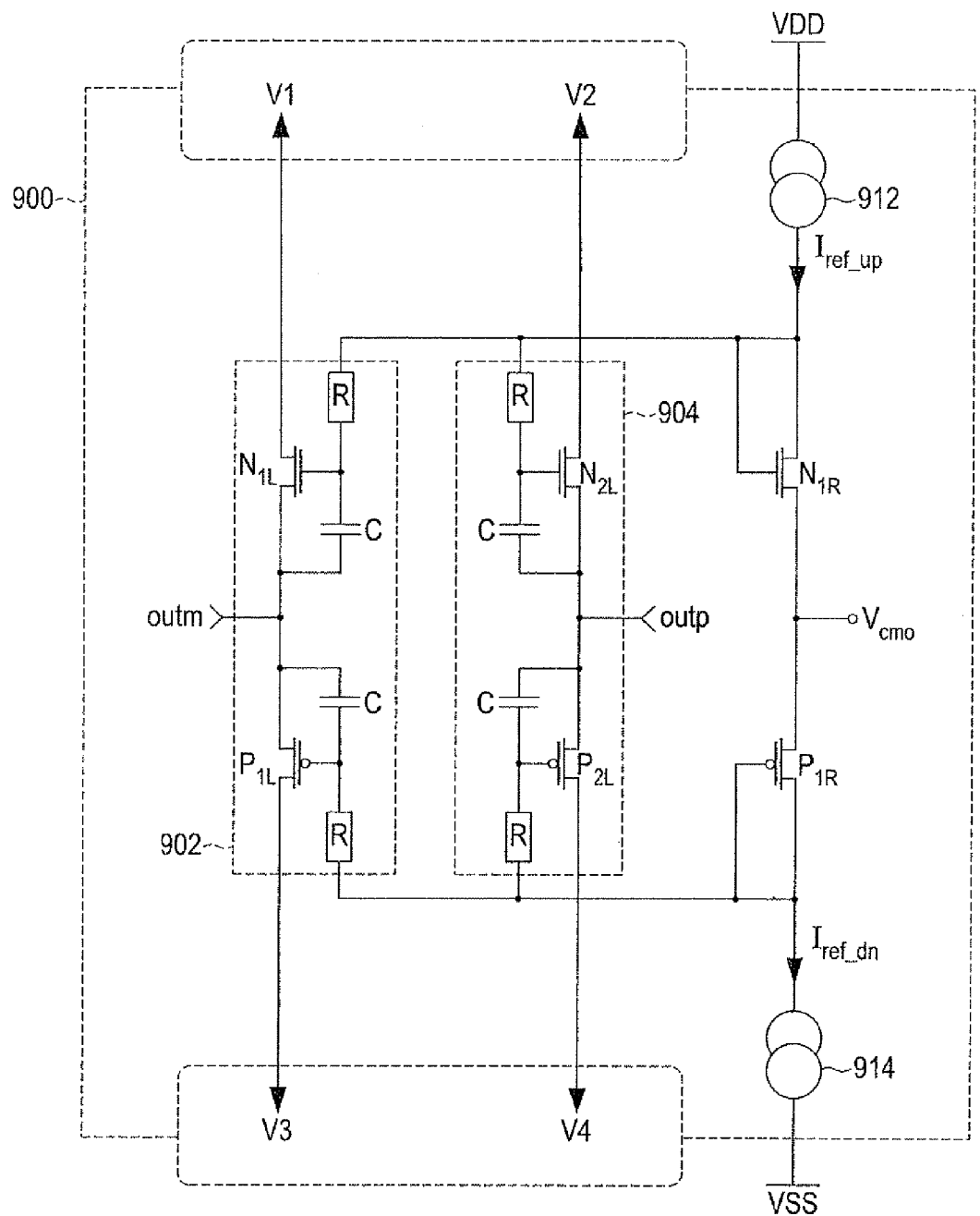
FIG. 9A shows a diagram of load circuit according to an embodiment of the disclosure.

FIG. 9A shows a diagram of a load circuit 900 according to an embodiment of the disclosure. The load circuit 900 can be used in the disclosed differential amplifiers, such as the differential amplifiers 100, 100', 100", 200, 200', 700, 800, and the like, to serve as the load for the differential amplifiers.

In the FIG. 9A example, the load circuit 900 uses MOS transistors to form resistive components 902 and 904. Specifically, an N-type MOS transistor $N_{1R}$ and a P-type MOS transistor $P_{1R}$ are diode-connected to generate suitable gate bias voltages in response to reference currents $I_{ref\_up}$ and $I_{ref\_dn}$. Further, the gate bias voltage generated by $N_{1R}$ is provided to N-type MOS transistors $N_{1L}$ and $N_{2L}$; and gate bias voltage generated by $P_{1R}$ is provided to P-type MOS transistors $P_{1L}$ and $P_{2L}$. Transistors $N_{1L}$ and $P_{1L}$ of the resistive component 902 are respectively configured as current sources to serve as resistive loads for the output node outm, and transistors $N_{2L}$ and $P_{2L}$ of the resistive component 904 are respectively configured as current sources to serve as resistive loads for the output node outp.

Further, in the FIG. 9A example, voltage lines V1 and V2 may be connected to a same voltage potential. Likewise, voltage lines V3 and V4 may be connected to a same voltage potential. In some embodiments, each of the four voltage lines V1-V4 may be connected to different biasing voltage potentials.

Additionally, in the FIG. 9A example, resistors R are used to couple the gate bias voltages to the gate terminals of the transistors $N_{1L}$, $P_{1L}$, $N_{2L}$ and $P_{2L}$. In an example, capacitance C represents the parasitic capacitance of transistors $N_{1L}$, $P_{1L}$, $N_{2L}$ and $P_{2L}$. In some embodiments, the capacitance C includes a real capacitor in addition to the parasitic capacitance. The resistors R improve high frequency behavior of a differential amplifier that uses the load circuit 900.

It is noted that the load circuit 900 can be suitably modified. In an example, the N-type MOS transistors $N_{1L}$, $N_{2L}$, and $N_{1R}$ are omitted; in another example, the P-type MOS transistors $P_{1L}$, $P_{2L}$, and $P_{1R}$ are omitted.

Figure 9B:
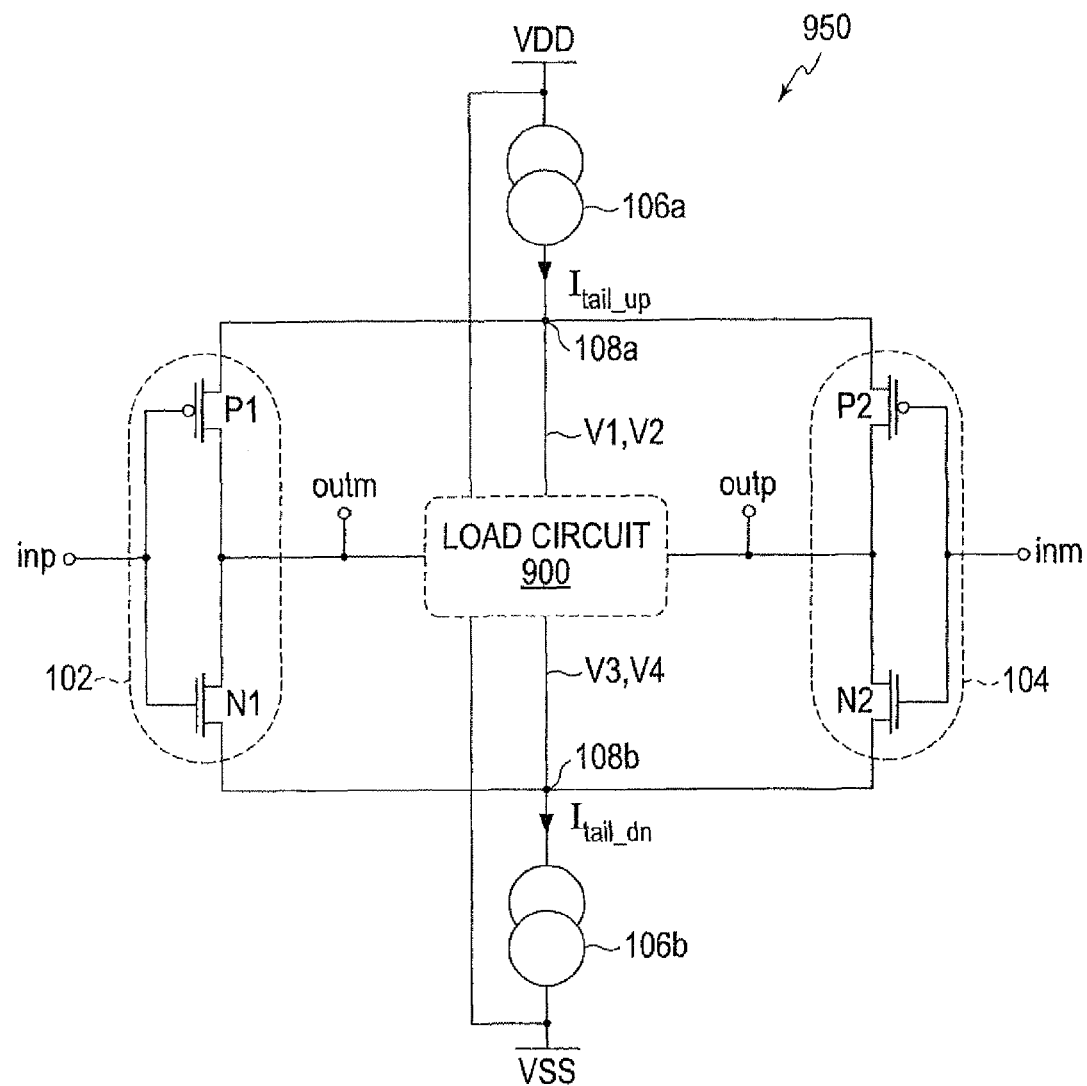
FIG. 9B shows a diagram of a differential amplifier with the load circuit of FIG. 9A.

FIG. 9B shows a diagram of a differential amplifier 950 according to an embodiment of the disclosure. The differential amplifier 950 operates similarly to the differential amplifier 100 described above. The differential amplifier 950 also utilizes certain components that are identical or equivalent to those used in the differential amplifier 100; the description of these components has been provided above and will be omitted here for clarity purposes. The differential amplifier 950 uses the load circuit 900 in the place of the load circuit 109.

In the FIG. 9B example, the voltage lines V1 and V2 are connected to node 108a to have the same potential as the source potential of P1 and P2. The voltage lines V3 and V4 are connected to node 108b to have the same potential as the source potential of N1 and N2.

It is noted that the voltage lines V1-V4 can be tied to other suitable voltage potentials.

Figure 10:
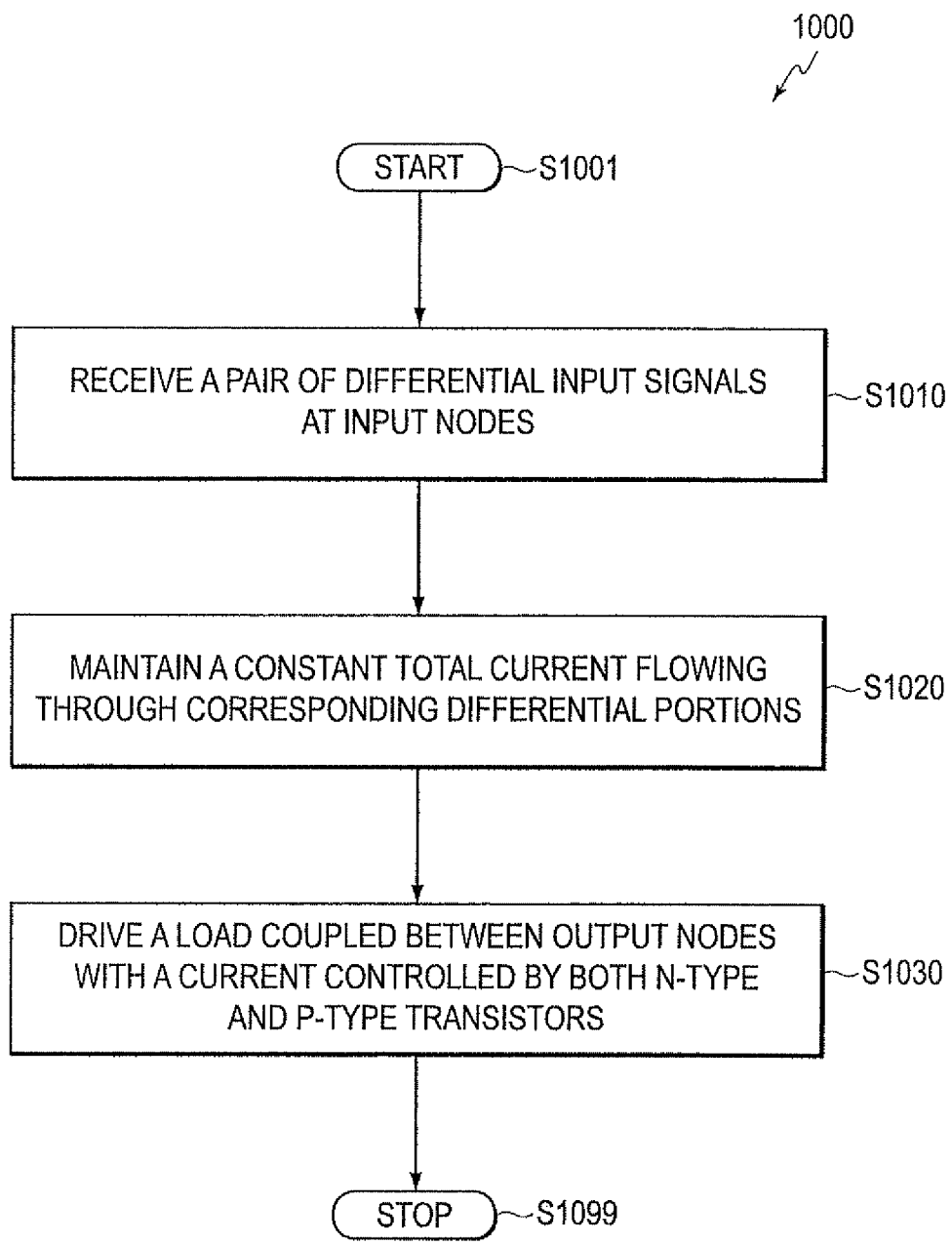
FIG. 10 shows a flow chart outlining a process example 1000 according to an embodiment of the disclosure.

FIG. 10 shows a flow chart outlining a process example 1000 executed by a differential amplifier, such as the differential amplifier 100, the differential amplifier 200, and the like, according to an embodiment of the disclosure. The differential amplifier includes a pair of matching complementary pairs that have both P-type transistors and N-type transistors. The process starts at S1001 and proceeds to S1010.

At S1010, a pair of differential input signals is received at the input nodes of the differential amplifier. For example, the input nodes inp and inm of the differential amplifier 100 receive a pair of differential input signals. The signal received by the input node inp controls the gate terminals of both the P-type transistor P1 and the N-type transistor N1, and the signal received by the input node inm controls the gate terminals of both the P-type transistors P2 and the N-type transistor N2.

At S1020, a total current flowing through corresponding differential portions of the differential amplifier is maintained substantially constant. For example, the current source 106a maintains a relatively constant total current flowing through the P-type transistors P1 and P2, and the current source 106b maintains a relatively constant total current flowing through the N-type transistors N1 and N2.

At S1030, a current is driven though a load circuit coupled between output nodes of the differential amplifier to generate a pair of differential output signals. The current is amplified with regard to the differential input signals. The amplification of the current is contributed by both N-type transistors and P-type transistors. For example, the differential amplifier 100 drives a current through the load circuit 109 coupled between the output nodes outm and outp to generate the differential output voltages signals. The current is amplified with regard to the differential input signals. The amplification of the current is contributed by both the N-type transistors N1 and N2 and the P-type transistors P1 and P2. Then, the process proceeds to S1099 and terminates.

It is noted that the process 1000 can include additional steps. In an example, the differential amplifier 200 can include a step to suppress a common mode response at the output nodes.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A differential amplifier comprising:
   a first pair of complementary transistors with first control terminals coupled to a first input node of the differential amplifier and first driving terminals coupled to a first output node of the differential amplifier for driving a load;
   a second pair of complementary transistors with second control terminals coupled to a second input node of the differential amplifier and second driving terminals coupled to a second output node of the differential amplifier for driving the load;
   a current source configured to maintain a substantially constant total current flow through the first pair of complementary transistors and the second pair of complementary transistors; and
   a reference voltage generator configured to generate a reference voltage based on a third pair of complementary transistors that is diode-connected for maintaining a common mode voltage level at the first output node and the second output node with reference to the reference voltage.

2. The differential amplifier of claim 1, wherein the current source is a first current source, the differential amplifier further includes a second current source, and the first current source and the second current source are respectively configured to maintain a first substantially constant current from a high voltage source, and a second substantially constant current from a low voltage source.

3. The differential amplifier of claim 1, further comprising:
   a common mode feedback circuit configured to suppress a common mode response at the first output node and the second output node.

4. The differential amplifier of claim 3, wherein the common mode feedback circuit is configured to maintain a common mode level at the first output node and the second output node with reference to the reference voltage.

5. The differential amplifier of claim 1, wherein the third pair of complementary transistors has matching characteristics to the first pair and the second pair.

6. The differential amplifier of claim 1, wherein the reference voltage generator is configured to generate a feedback signal to a voltage regulator to enable the voltage regulator to adjust a supply voltage to the differential amplifier based on the feedback signal.

7. The differential amplifier of claim 6, wherein the feedback signal is provided to the voltage regulator that is on a same integrated circuit (IC) chip as the differential amplifier.

8. The differential amplifier of claim 6, wherein the feedback signal is provided to the voltage regulator that is external to an integrated circuit (IC) chip that includes the differential amplifier.

9. The differential amplifier of claim 1, further comprising:
   adjustable resistive components configured to adjust a gain of the differential amplifier.

10. The differential amplifier of claim 1, wherein the load includes a first current source load and a second current source load that are respectively coupled to the output nodes.

11. The differential amplifier of claim 10, wherein the first current source load and the second current source load use transistors of a same type.

12. The differential amplifier of claim 10, wherein the load includes a third current source load of a complementary type to the first current source load, and a fourth current source load of a complementary type to the second current source load.

13. The differential amplifier of claim 1, wherein the first pair of complementary transistors includes a first P-type metal-oxide-semiconductor (MOS) transistor, and a first N-type MOS transistor, the first control terminals are gate terminals of the first P-type MOS transistor and the first N-type MOS transistor, and the first driving terminals are drain terminals of the first P-type MOS transistor and the first N-type MOS transistor; and the second pair of complementary transistors includes a second P-type MOS transistor, and a second N-type MOS transistor, the second control terminals are gate terminals of the second P-type MOS transistor and the second N-type MOS transistor, and the second driving terminals are drain terminals of the second P-type MOS transistor and the second N-type MOS transistor.

14. A circuit, comprising:
  a pair of complementary transistors configured to have matching characteristics as complementary transistors pairs in a differential amplifier and to have diode-connected topology; and
  a feedback signal generating circuit configured to generate a feedback signal based on a voltage drop on the pair of complementary transistors, the feedback signal being used to adjust a supply voltage to the differential amplifier.

15. The circuit of claim 14, further comprising:
  a voltage regulator configured to regulate the supply voltage to the differential amplifier based on the feedback signal.

16. The circuit of claim 14, wherein the feedback signal is provided to an external voltage regulator that provides the supply voltage to the differential amplifier.

17. A method, comprising:
  receiving a pair of differential input signals at a first input node and a second input node of a differential amplifier, the first input node controlling control terminals of a first pair of N-type and P-type transistors, and the second input node controlling control terminals of a second pair of N-type and P-type transistors;
  maintaining a substantially constant total current flowing through the transistors of a same type;
  driving a load coupled between a first output node and a second output node of the differential amplifier with a current controlled by both types of transistors;
  generating a reference voltage based on a third pair of complementary transistors that is diode-connected; and
  maintaining a common mode voltage level at the first output node and the second output node with reference to the reference voltage.

18. The method of claim 17, further comprising:
  suppressing a common mode response of the first output node and the second output node.

* * * * *